United States Patent [19]

Murakami et al.

[11] Patent Number: 5,635,823
[45] Date of Patent: Jun. 3, 1997

[54] CURRENT DETECTOR CIRCUIT

[75] Inventors: Koichi Murakami, Yokohama; Motohiro Oomichi, Fujisawa, both of Japan

[73] Assignee: Kabushiki Kaisha Toshiba, Kawasaki, Japan

[21] Appl. No.: 539,159

[22] Filed: Oct. 4, 1995

[30] Foreign Application Priority Data

Oct. 6, 1994 [JP] Japan .................................. 6-243063

[51] Int. Cl.$^6$ ................................................ G05F 1/573
[52] U.S. Cl. ........................................ 323/277; 323/315
[58] Field of Search ................................ 323/277, 278, 323/315, 316; 324/105

[56] References Cited

U.S. PATENT DOCUMENTS

| | | | |
|---|---|---|---|
| 4,553,084 | 11/1985 | Wrathall | 323/316 |
| 4,672,302 | 6/1987 | DeShazo, Jr. et al. | 323/277 |
| 4,914,542 | 4/1990 | Wagoner | 323/277 |
| 5,545,970 | 8/1996 | Parkes, Jr. et al. | 323/277 |
| 5,550,462 | 8/1996 | Nakajima | 323/277 |

*Primary Examiner*—Stuart N. Hecker
*Attorney, Agent, or Firm*—Finnegan, Henderson, Farabow, Garrett & Dunner, L.L.P.

[57] ABSTRACT

In a current detector circuit wherein the sense current flowing through a sense transistor for sensing part of the main current flowing through a main element transistor is flowed through the detection resistor to cause the bipolar or MOS control transistor to detect the voltage drop across the detection resistor, a compensation diode connected to the base or gate of the control transistor and the emitter of the sense transistor and a forward bias generation resistor element for generating a forward bias applied to the diode for a time interval during which the main current flows are arranged. When a sense current flowing through a sense element for sensing part of a main current flowing through a main element is to be flowed through a detection resistor to cause a control transistor to detect a voltage drop across through the detection resistor, the temperature dependence of a threshold voltage between the base and emitter of the control transistor is compensated for, and an output current is detected with an almost constant current level during an operation.

14 Claims, 7 Drawing Sheets

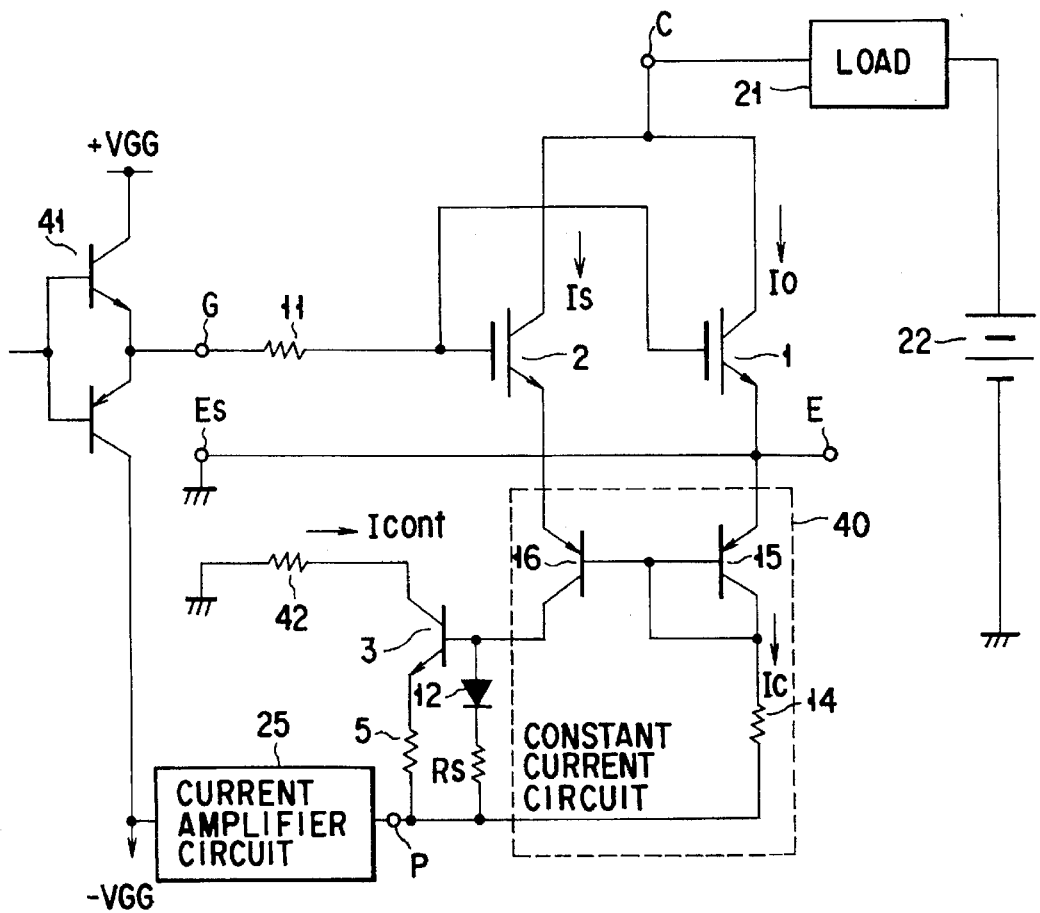
F I G. 4
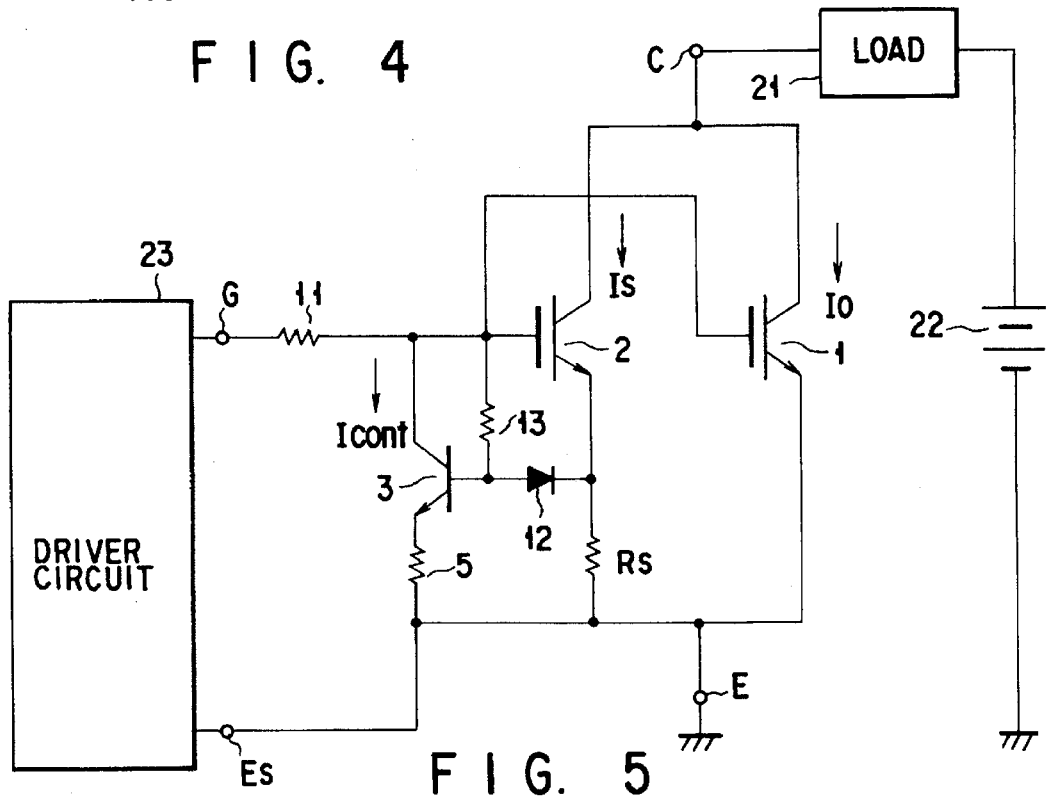
F I G. 5

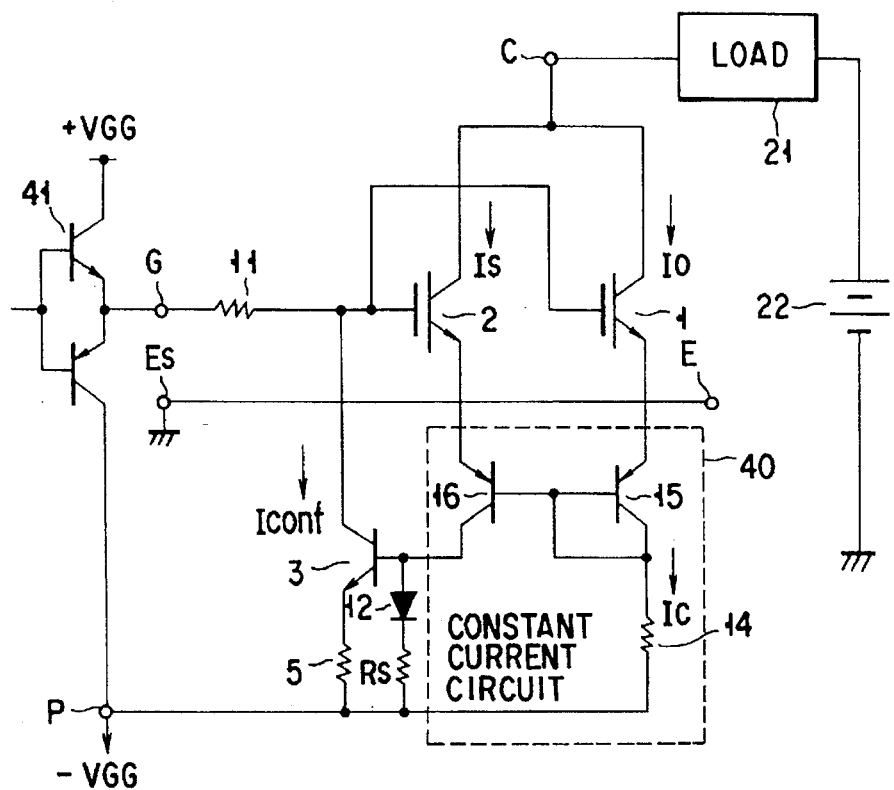
FIG. 6
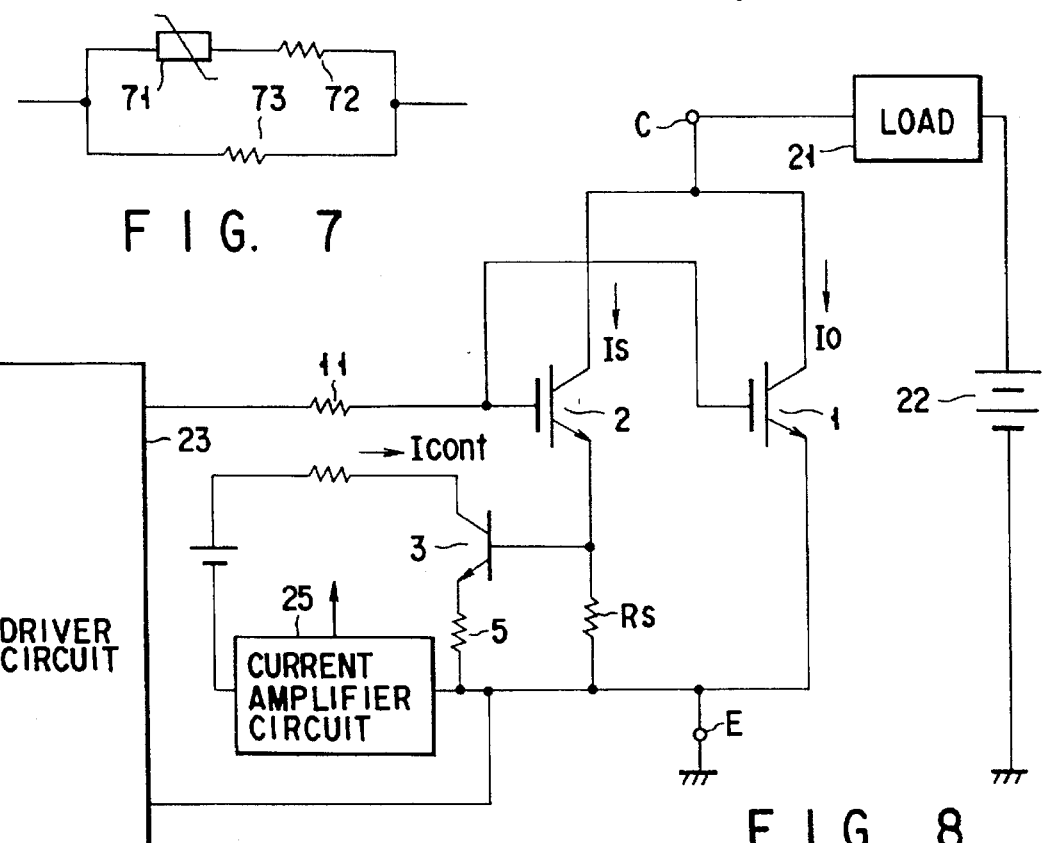
FIG. 7
FIG. 8
PRIOR ART

CURRENT DETECTOR CIRCUIT

BACKGROUND OF THE INVENTION

1. Field of the Invention

The present invention relates to a current detector circuit incorporated in a power semiconductor device, for detecting a main current flowing through an output main element and, more particularly, a current detector circuit for detecting a current flowing through a sense element for sensing part of the main current.

2. Description of the Related Art

In a power semiconductor integrated circuit device (e.g., a power integrated circuit device) having a power switching element such as an insulated gate bipolar transistor (IGBT) and a metal oxide semiconductor field effect transistor (MOSFET) for switching a large load current, a current detector circuit is often incorporated to detect an overcurrent of the power switching element. A protection circuit is also incorporated to protect the integrated circuit device from thermal breakdown caused by the overcurrent.

FIG. 8 and FIG. 9A show conventional current detector circuits, respectively.

To detect a main current Io flowing through an IGBT 1 serving as an output main element, the current detector circuit of the first prior art shown in FIG. 8 causes an IGBT 2 serving as a sense element to sense part of the main current. When the sense current Is flows through a current detection resistor element Rs, a voltage drop Vs occurs across the resistor element Rs. When the voltage drop Vs exceeds the base-emitter threshold voltage of a control transistor 3 (npn transistor in this example), the control transistor 3 is triggered to flow a control current Icont from a bias power supply circuit through the control transistor 3. When the control current Icont flows, a control signal corresponding to the control current Icont is output from a current amplifier circuit 25 functioning as a control circuit. The overcurrent of the main element is detected using this control signal, thereby causing a protection circuit (not shown) to protect the main element from the overcurrent.

In the circuit of the first prior art, however, the base-emitter threshold voltage of the control transistor undesirably changes depending on a temperature dependence in accordance with a temperature rise (change in temperature) caused by currents flowing through the respective parts during an operation.

The current detector circuit as the second prior art shown in FIG. 9A is a circuit improved for compensating for the temperature dependence of the base-emitter threshold voltage of the control transistor 3 in the current detector circuit of the first prior art. The circuit of the second prior art is different from the circuit of the first prior art in that a diode 12 having substantially the same temperature dependence as that of the base-emitter threshold of the control transistor 3 is inserted in series with the current detection resistor element Rs. The diode 12 is formed by a p-n junction which has substantially the same characteristic as that of the base-emitter p-n junction of the control transistor 3.

The operation of the circuit of the second prior art is basically almost the same as that of the circuit of the first prior art, except for an operation associated with temperature compensation by the diode 12. When the base-emitter threshold voltage of the control transistor 3 changes depending on its temperature dependence, a forward voltage drop of the diode 12 inserted in series with the current detector resistor element Rs (detection resistor) changes depending on its temperature dependence. Since the temperature dependence of the control transistor 3 is almost equal to that of the diode 12, a change in base-emitter threshold voltage of the control transistor 3 can be compensated for.

In each prior art described above, the sense element 2 may be monolithically formed in an integrated circuit chip having the main element 1 on a silicon substrate. Alternatively, the sense element 2 may be formed in an integrated circuit chip different from that having the main element, and the resultant sense element integrated circuit chip may be externally connected to the main element integrated circuit.

In the circuit of each prior art described above, current detection is performed under an assumption that the main current Io and the sense current Is have a predetermined ratio (e.g., n:1). That is, the following equation is established:

$$Io = n.Is$$

Note Vs can be expressed by the following equation:

$$Vs = Rs.Is$$

so that the main current Io can be expressed using the above two equations:

$$Io = n.Vs/Rs \quad (1)$$

The control current Icont flowing through the control transistor 3 and the main current Io flowing through the main element IGBT 1 are assumed to be operated to satisfy a predetermined relationship. When a preset value is determined for the control current Icont in advance based on the assumption, the value of the main current Io can be controlled.

However, in an actual operation, the relation represented by equation (1) cannot be necessarily established. A protection operation for the main element on the basis of detection of a predetermined level of the main current Io, i.e., a normal protection operation may not be realized. This phenomenon may be estimated due to the following reasons (A) and (B).

(A) In the circuit of the first prior art, the above phenomenon is caused by an increase in temperature dependence of a base-emitter voltage VBE (or a gate-source voltage VGS in a MOS transistor) of the control transistor 3 (when a temperature increases, the voltages VBE and VGS are generally lowered). More specifically, as shown in FIG. 11, a threshold voltage Vth of the voltage VBE (or VGS) of the control transistor 3 is greatly changed with temperature changes. For this reason, the detection level for an overcurrent of the main current Io corresponding to the voltage drop Vs (=Rs.Is) across the detection resistor Rs so as to turn on the control transistor 3 is greatly changed with temperature changes, as shown in FIG. 12 (the detection level of the overcurrent of the main current Io normally is lowered at higher temperatures). Therefore, the protection operation against the overcurrent cannot be affected.

(B) Although the circuit of the second prior art is an improved circuit of the first prior art so as to compensate for the temperature dependence of the base-emitter threshold voltage of the control transistor 3, the above phenomenon occurs because a predetermined sense ratio (=Io/Is) cannot be obtained.

That is, the equivalent circuit of the circuit of the second prior art is shown in FIG. 9B, and the following equation is established:

$$Vs = Io.Rs.(VCESAT - VF)/(n.VCESAT + Io.Rs)$$

where VCESAT is the saturation voltage of the circuit including the main element circuit and the sense current circuit, when viewed across the external terminals C and E.

At this time, when a forward voltage drop VF of the temperature compensation diode is sufficiently smaller than the voltage value VCESAT, and the voltage drop Vs across the detection resistor Rs is sufficiently lower than VCESAT, that is, when the following conditions are satisfied:

VCESAT>>VF

VCESAT>>Rs.Is=Rs-Io/n equation (2) is rewritten as follows:

Vs=Rs.Io/n which is equal to equation (1).

In practice, however, VF=0.5 to 0.6 V is obtained for VCESAT=2 to 3 V, which does not satisfy the conditions for establishing equation (1).

In an actual operation, the trigger level of the control transistor 3 cannot be substantially constant with respect to the main current Io. The problem in which the protection operation against the overcurrent cannot be stably effected like the circuit of the first prior art is left unsolved.

In addition, as can be apparent from equation (1), Rs must also be set sufficiently low, and the base-emitter threshold voltage of the control transistor 3 and the sense current value must be carefully designed.

As shown in the characteristics (actual measurement data representing linearity of detection current vs. output current in FIG. 13, each of the circuits of the first and second prior arts is found to have a large current detection offset (i.e., an operation delay range until a detection current flows upon flowing the main current Io). This large current detection offset may be caused because the voltage drop Vs across the detection resistor Rs or the voltage Vs+VF cannot be neglected under nominal operation range of the main current Io (i.e., a range in which VCESAT is low), and the detection current Is of the current detection IGBT 2 tends not to flow. Therefore, the circuits of the first and second prior arts cannot accurately detect currents.

In the current detector circuit of the first prior art has a temperature dependence on the base-emitter threshold voltage of the control transistor 3. The overcurrent detection level of the main current corresponding to the voltage drop across the detection resistor at the turn-on occasion of the control transistor 3 is greatly varied depending on temperatures. The protective operation against the overcurrent cannot be normally performed on the basis of the detection current output.

Although the current detector circuit of the second prior art can compensate for the temperature dependence on the base-emitter threshold voltage of the control transistor 3, a constant sense ratio n (=Io/Is) of the main current Io to the sense current Is cannot be obtained. As a result, the protection operation against the overcurrent cannot be desirably performed.

SUMMARY OF THE INVENTION

The present invention has been made to solve the conventional problems described above, and has as its object to provide a current detector circuit for causing a sense current flowing a sense element for sensing part of a main current flowing through a main element to flow across a detection resistor, thereby causing a control transistor to detect a voltage drop across the detection resistor, wherein the temperature dependence of a base-emitter threshold voltage of the control transistor can be compensated for, an output overcurrent can be detected with an almost constant current level during an operation, and a protection operation against the overcurrent can be desirably performed on the basis of the detection current output.

According to the first aspect of the present invention, there is provided a current detector circuit comprising a first insulating gate transistor for a main element; a second insulating gate transistor for a sense element, a current input terminal of which is connected to a current input terminal of the first insulated gate transistor, and a control terminal of which is connected to a control terminal of the first insulated gate transistor, the second insulating gate transistor for sensing part of a main current flowing through the first insulating gate transistor; a current detection resistor through which a sense current flowing through the second insulated gate transistor flows; a control transistor for detecting a voltage drop across the current detection resistor; and a compensation diode connected between a control terminal of the control transistor and a current output terminal of the second insulated gate transistor.

According to the second aspect of the present invention, there is provided a current detector circuit comprising a first insulating gate transistor for a main element; a second insulating gate transistor for a sense element, a current input terminal of which is connected to a current input terminal of the first insulated gate transistor, and a control terminal of which is connected to a control terminal of the first insulated gate transistor, the second insulating gate transistor for sensing part of a main current flowing through the first insulating gate transistor; a current detection resistor through which a sense current flowing through the second insulated gate transistor flows; a control transistor for detecting a voltage drop across the current detection resistor; a constant current circuit, connected to a current output terminal of the first insulated gate transistor and a current output terminal of the second insulated gate transistor, the constant current circuit for setting potentials at the current output terminals of the first and second insulated gate transistors to equal to each other; and a compensation diode and a current detection resistor element which are inserted in series with each other between an output current path of the constant current circuit and a negative bias terminal.

According to the first aspect, the base-emitter (gate source) threshold voltage characteristic and the temperature characteristic compensation diode is connected between the base or gate of the control transistor and the emitter of the sense transistor. With this arrangement, the compensation diode compensates for the temperature dependence characteristic of the base-emitter threshold voltage of the control transistor for detecting the voltage drop across the detection resistor. Furthermore, with the arrangement, the compensation diode does not affect the potential of the emitter of the sense transistor. Thus, the control current flows almost simultaneously with the main current. The main current can be detected with almost the constant current level during the operation.

According to the second aspect, the constant current circuit is arranged between the emitters of the main and sense transistors to set their emitter currents to equal to each other. The linearity of the control and main currents flowing through the control transistor for detecting the voltage drop across the detection resistor can be improved. Therefore, current control can be performed while the main current can be detected with almost the constant level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a circuit diagram showing a current detector circuit according to a second embodiment of the present invention;

FIG. 5 is a circuit diagram showing a modification of the current detector circuit shown in FIG. 1;

FIG. 6 is a circuit diagram showing a modification of the current detector circuit shown in FIG. 4;

FIG. 7 is an equivalent circuit diagram showing a modification of a diode in the current detector circuit of the present invention;

FIG. 8 is a circuit diagram showing a conventional current detector circuit;

DETAILED DESCRIPTION OF THE PREFERRED EMBODIMENTS

Figure 1:
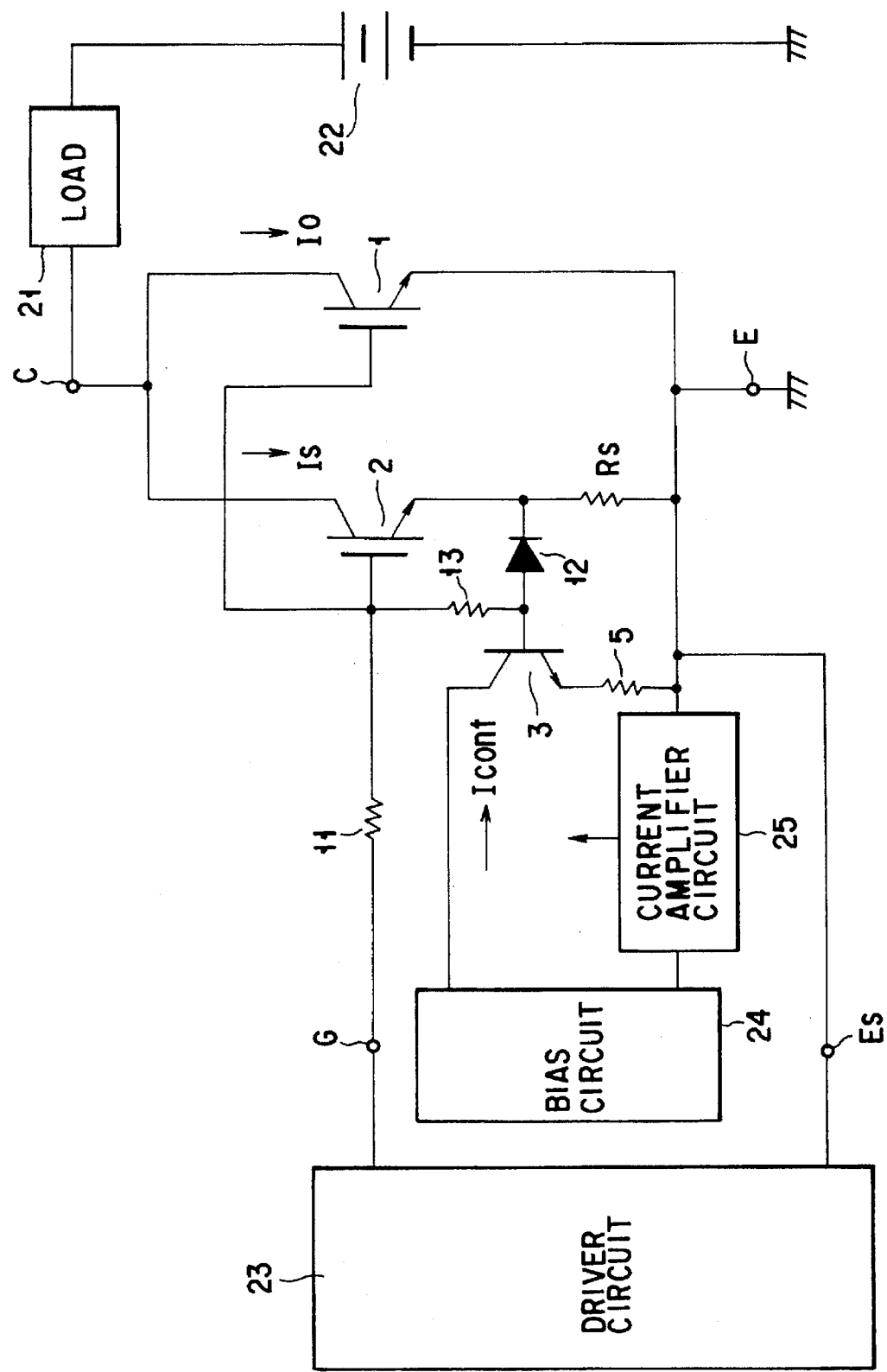
FIG. 1 is a circuit diagram showing a current detector circuit according to a first embodiment of the present invention.

The preferred embodiments of the present invention will be described in detail with reference to the accompanying drawings. FIG. 1 shows a current detector circuit according to the first embodiment of the present invention. This current detector circuit is arranged in a power integrated circuit device having a power switching element (an IGBT 1 in this embodiment) for switching a large load current and detects an overcurrent of the IGBT 1 serving as the power switching element. The integrated circuit device is protected from thermal breakdown caused by the overcurrent by means of a protection circuit (not shown).

Referring to FIG. 1, reference numeral 2 denotes a second IGBT serving as a sense element for sensing part of a main current of the IGBT 1 to detect the main current flowing through the IGBT 1 serving as the output main element. The bases of the first and second IGBTs 1 and 2 are connected to each other and are also connected to a drive gate terminal G of the integrated circuit device through a gate input resistor 11. The collectors of the first and second IGBTs 1 and 2 are connected to a main collector terminal C of the integrated circuit device. The emitter of the first IGBT 1 is connected to a main emitter terminal E of the integrated circuit device. The emitter of the second IGBT 2 is connected to the main emitter terminal E through a current detector resistor element Rs. Note that the main collector terminal C of the integrated circuit device is connected to an external DC power supply 22 through an external load 21, and the main emitter terminal E is grounded. A signal emitter terminal Es of the integrated circuit device is connected to the main emitter terminal E.

Figure 14:
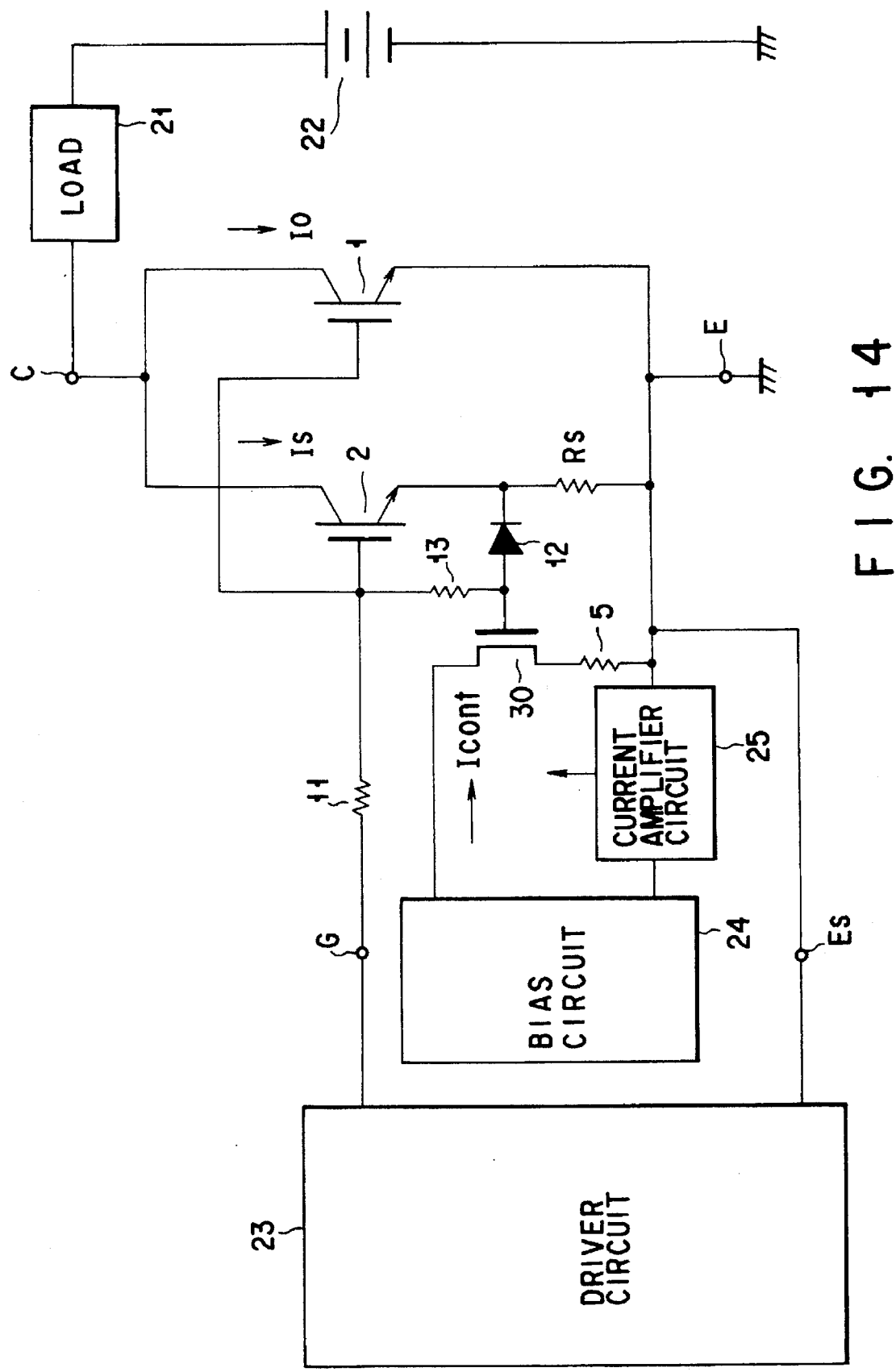
FIG. 14 is a circuit diagram showing a modification of the current detector circuit in FIG. 1 wherein the npn control transistor in FIG. 1 is replaced with an n-channel MOS transistor.

Reference numeral 3 denotes a control transistor (a bipolar npn transistor in this embodiment) for detecting a voltage drop across the current detection resistor element Rs. The emitter of the npn transistor is connected to the emitter terminal E through an emitter resistor 5 inserted to reduce an influence caused by variations in emitter-base resistance of the npn transistor 3. The control npn transistor 3 may be an n-channel MOS transistor. FIG. 14 shows a current detector circuit corresponding to the current detector circuit in FIG. 1 in use of the n-channel MOS transistor. An n-channel MOS transistor in FIG. 14 is denoted by reference numeral 30.

In addition, a compensation diode 12 is connected between the base of the npn transistor 3 and the emitter of the second IGBT 2. The anode of the diode 12 is connected to the base of the npn transistor 3, and the cathode of the diode 2 is connected to the emitter of the second IGBT 2. The diode 12 is formed by a p-n junction as in the conventional arrangement and has almost the same characteristic as that of a p-n junction between the base and emitter of the control transistor 3. Therefore, these p-n junctions have substantially the same temperature dependence. That is, the temperature dependence of the base-emitter threshold voltage of the control transistor 3 is almost equal to that of the diode. A forward bias generation resistor element 13 for forward-biasing the diode 12 for a time interval during which the main current flows is connected between the base of the IGBT 1 and the base of the npn transistor 3. Since the diode 12 is not inserted between the emitter of the second IGBT 2 and the resistor element Rs, the diode 12 does not affect the potential of the emitter of the second IGBT 2.

In the above current detector circuit, a gate voltage is applied from a driver circuit 23, across the driver gate terminal G and the signal emitter terminal Es so that the gates of the first and second IGBTs 1 and 2 are set at positive potentials with respect to their emitters. When the gate voltage exceeds the threshold voltage levels of the first and second IGBTs 1 and 2, collector currents start to flow from the external DC power supply 22 to the first and second IGBTs 1 and 2 through the external load 21. At this time, a current flowing through the forward bias generation resistor element 13 is supplied to the base of the npn transistor 3 and to the signal emitter terminal Es of the main element driver circuit 23 through the compensation diode 12 and the current detection resistor element Rs, thereby forward-biasing the diode 12.

The forward bias generation resistor element 13 generates only a current larger than the sum of the base current value (determined based on a current amplification factor hFE of the npn transistor 3 and a preset value of the control current Icont flowing through the npn transistor 3) and a current value selected to forward-bias the diode 12. For this purpose, relation R13>>Rs is generally established, where R13 is the resistance value of the forward bias generation resistor element 13, and Rs is the resistance value of the current detection resistor element Rs. Note that current consumption is undesirably increased when the resistance value R13 of the forward bias generation resistor element 13 is excessively small, which must be avoided.

When the main current Io starts to flow and the sense current Is also starts to flow, the npn transistor 3 is triggered to flow the control current Icont from the npn transistor 3 to a bias circuit 24. This control current Icont is fed back to the bias circuit 24 through a current amplifier circuit 25. A control signal corresponding to the feedback input is output from a current amplifier circuit 25. An overcurrent of the IGBT 1 is detected on the basis of this control signal to cause a protection circuit (not shown) to control to protect the first IGBT 1 from breakdown caused by the overcurrent.

Figure 10:
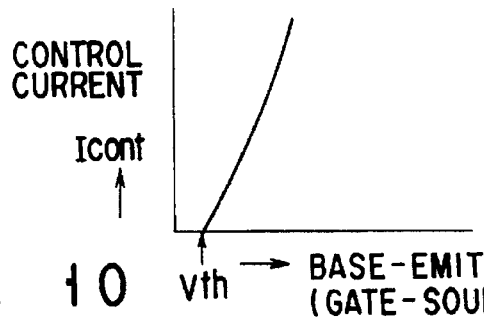
FIG. 10 is a graph showing actual measurement data of the temperature dependence of a base-emitter voltage VBE of the control transistor in the conventional current detector circuit shown in FIG. 9A.
Figure 11:
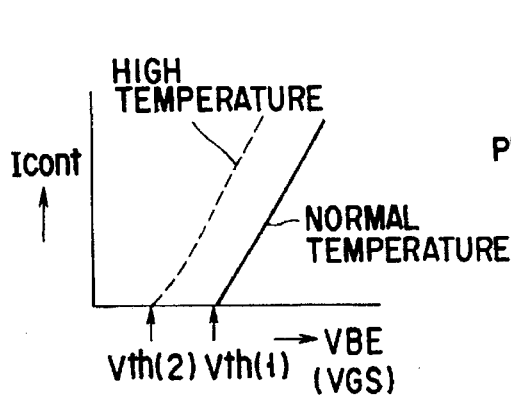
FIG. 11 is a graph showing the relationship between a control current Icont flowing through the control transistor and a base-emitter voltage $V_{BE}$ of the control transistor in the conventional current detector circuit shown in FIG. 9A.
Figure 12:
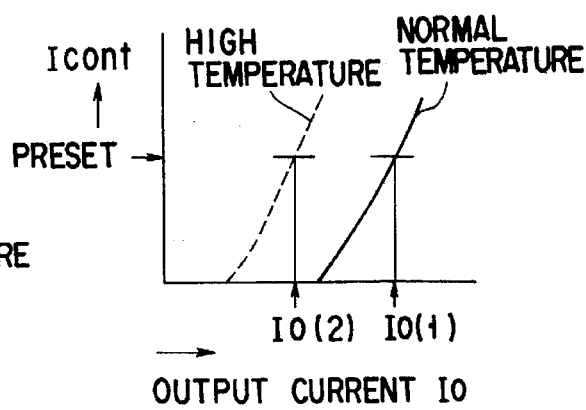
FIG. 12 is a graph showing the relationship between a main current Io flowing through the main element in the current detector circuit shown in FIG. 9A and a control current Icont flowing through the control transistor.

The characteristic feature of the operation of the current detector circuit of the first embodiment lies in that the control current Icont starts to flow to the npn transistor simultaneously when the main current Io and the sense current Is start to flow through the first and second IGBTs 1 and 2, respectively, since the emitter potential of the IGBT 2 is not affected by the compensation diode 12 being not inserted between the emitter of the IGBT 2 and the detection resistor Rs. The problem posed by the conventional arrangement in which the main current Io is detected to determine a reference, i.e., a threshold voltage for flowing the control current Icont can be solved in the first embodiment. In the conventional arrangement, as shown in FIG. 10, the control current Icont does not flow until the base emitter voltage of the control transistor reaches the threshold voltage Vth.

The base-emitter voltage VBE of the npn transistor 3 is lowered with an increase in temperature during the circuit operation. A change in voltage caused by this temperature change can be corrected by a change in a forward voltage drop VF of the diode 12 which is caused by the temperature change. The emitter resistor 5 for the npn transistor 3 and the current detection resistor element Rs are set to appropriate values to obtain an almost constant main current Io with respect to the preset value of the control current Icont, thereby greatly improving the temperature dependence of the main current Io as compared with the conventional case.

Figure 2:
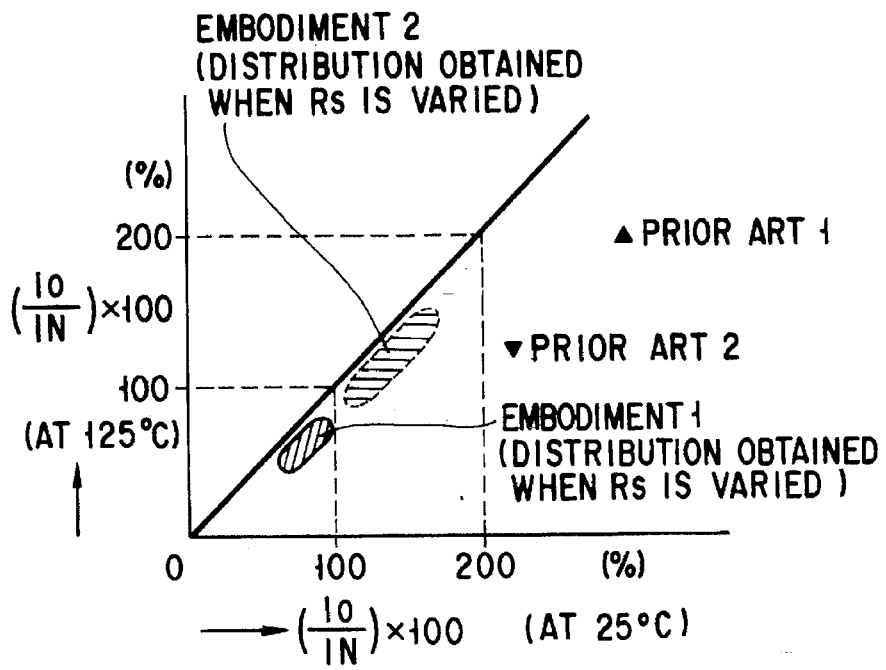
FIG. 2 is a graph showing actual measurement data of temperature dependences of an output current in the current detector circuit of the first embodiment, second embodiment, first prior art and second prior art.
Figure 3:
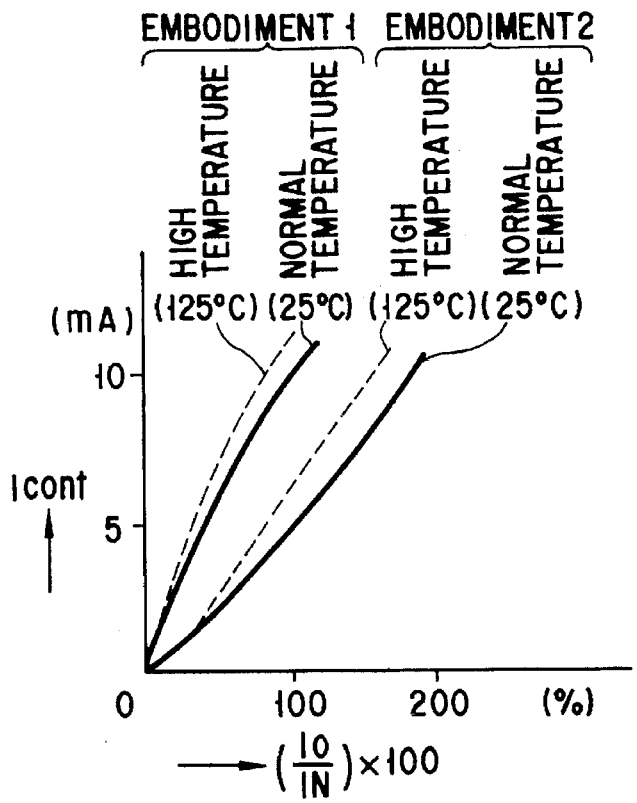
FIG. 3 is a graph showing actual measurement data of linearity of detection current Vs output current in the current detector circuit shown in FIG. 1 (first embodiment) and FIG. 4 (second embodiment)
Figure 9A:
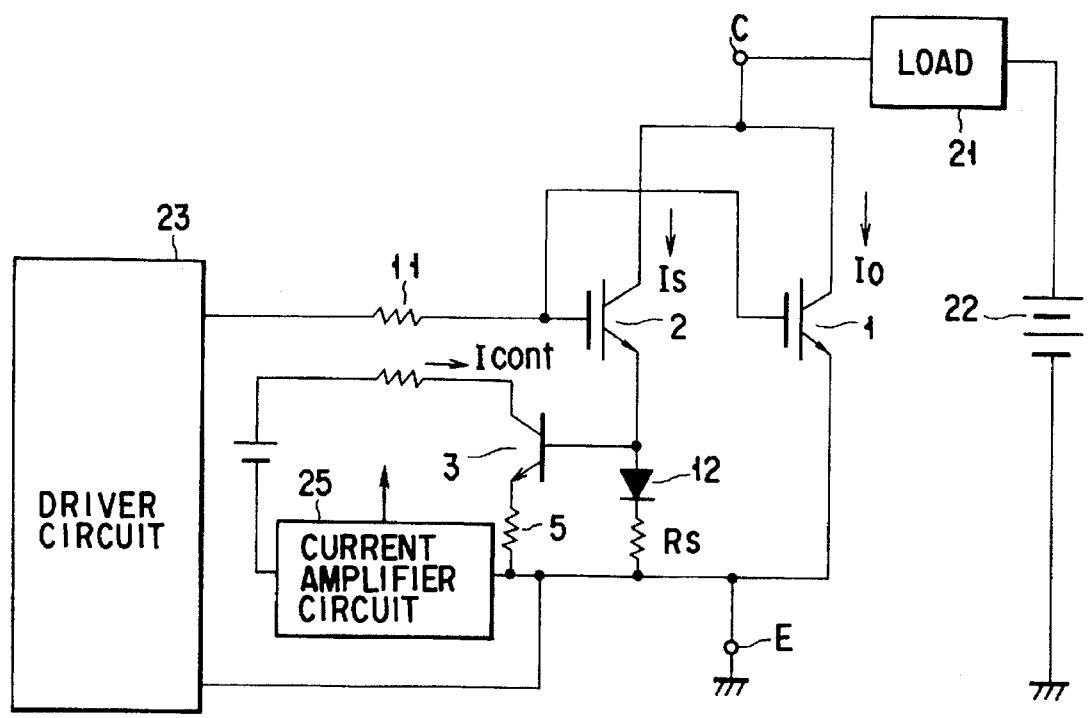
FIG. 9A is a circuit diagram showing another conventional current detector circuit.
Figure 9B:
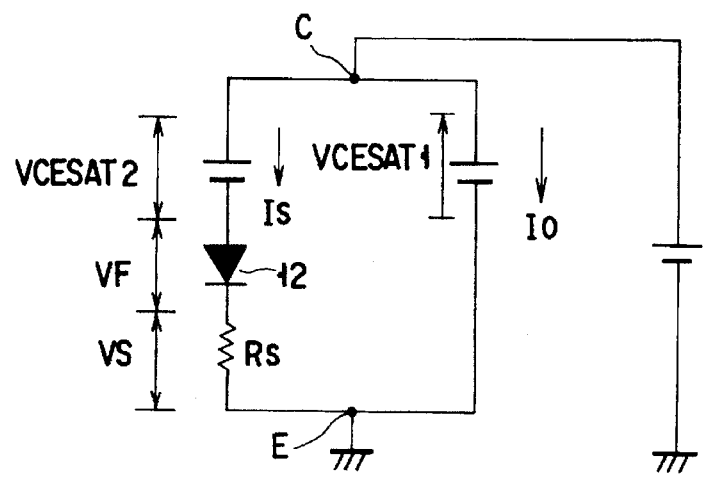
FIG. 9B is an equivalent circuit diagram showing part of the conventional current detector circuit shown in FIG. 9A.

The above effect of the first embodiment is apparent from the characteristics (actual measurement data of the temperature dependence of the constant current output value at the preset value of the control current Icont) in FIG. 2 and the characteristics (actual measurement data of linearity of detection current vs. output current) in FIG. 3. In this case, as can be apparent from FIG. 2, in the first embodiment, an overcurrent is detected in a variable range of the current detection resistor element Rs in which a ratio (Io/IN) of the main current Io to a rated element current IN of the element is 100% or less. However, the values of the resistor element Rs and the control current Icont are appropriately set to optimize the operation of the current detector circuit.

As described above, the temperature dependence of overcurrent detection can be greatly improved. Furthermore, the characteristic of the control current Icont and the main current Io does not have a non-responsive region and linearly changes. That is, in addition to advantages in overcurrent detection and breakdown protection, the control current Icont starts to flow simultaneously when the main current Io starts to flow and furthermore can be linearly controlled in accordance with the value of the main current Io.

FIG. 4 shows a current detector circuit according to the second embodiment of the present invention. This current detector circuit is different from the current detector circuit of the first embodiment in that (1) a constant current circuit 40 is connected between the emitter (main emitter terminal E) of a first IGBT 1 for a main element and the emitter of a second IGBT 2 for a sense element to set the emitter potentials of these transistors to equal to each other, (2) a temperature compensation diode 12 is connected in series with a current detector resistor element Rs between the emitter of the second IGBT 2 and a negative bias terminal P through part of the constant current circuit 40, the base of the control npn transistor 3 is connected to the anode of the diode 12, and the forward bias generation resistor element 13 is omitted, (3) an emitter resistor 5 for the control npn transistor 3 is connected to the negative bias terminal P, (4) a main element driver circuit 41 applies, to the drive gate terminal G, a gate voltage changing positively and negatively with respect to a signal emitter terminal Es (ground potential), (5) a control bias circuit comprises a resistor 42 connected between the collector of the control transistor 3 and the ground terminal, and (6) a current amplifier circuit 25 is connected between the negative bias terminal P and a negative bias power supply (—VGG). The remaining arrangement of the current detector circuit of the second embodiment is the same as that of the first embodiment. The same reference numerals as in FIG. 1 denote the same parts in FIG. 4, and a detailed description thereof will be omitted.

The constant current circuit 40 comprises, e.g., a bipolar current mirror circuit. The constant current circuit 40 comprises a first pnp transistor 15, the emitter of which is connected to the emitter of the first IGBT 1, and the base and collector of which are connected to each other, a constant current value setting resistor element 14 connected between the collector of the first pnp transistor and the negative bias terminal P, and a second pnp transistor 16, the emitter of which is connected to the emitter of the second IGBT 2, and the base of which is connected to the base of the first pnp transistor 15. The anode of the diode 12 is connected to the collector of the second pnp transistor 16. The first pnp transistor 15 and the resistor element 14 constitute a current path through which a reference current flows. The second pnp transistor 16 constitutes an output current path through which an output current equal to the reference current flows.

The operation of the current detector circuit according to the second embodiment is the same as that according to the first embodiment as follows. With an increase in temperature during the circuit operation, a base-emitter voltage VBE of the control transistor 3 is lowered. A voltage change caused by the temperature change is corrected by a change in forward voltage drop VF caused by the temperature change in the diode 12 having a p-n junction having almost the same characteristics as those of the p-n junction of the control transistor 3. The emitter resistor 5 for the control transistor 3 and the current detection resistor element Rs are set to have appropriate values to obtain an almost constant main current Io with respect to the preset value of a control current Icont. A variation (variable ratio) in current sense ratio caused by a difference between the emitter potential of the first IGTB 1 and the emitter potential of the second IGBT 2, which phenomenon has occurred in the conventional example, can be eliminated because the constant current circuit 40 for setting the emitter potentials of the above transistors to equal to each other is connected. More specifically, a negative bias potential (—VGG) is applied, through the current amplifier circuit 25, to a negative bias terminal P connected to an output element portion, a sense element portion, and a current control circuit portion. At the same time, a collector current Ic of the first pnp transistor 15 which is determined by the value of the constant current value setting resistor element 14 flows between the main emitter terminal E and the negative bias terminal P. At this time, the emitter potential of the second IGBT 2 is always equal to VE, i.e., VE+VBEQP1−VBEQP2, where VBEQP1 and VBEQP2 are base-emitter voltages of the first and second pnp transistors 15 and 16, with reference to the emitter potential VE of the first IGBT 1. Thus, the emitter potential of the first IGBT 1 equals to that of the second IGBT 2 during the operation. Accordingly, the current division ratio of n:1 of the main IGBT 1 and the sense IGBT 2 can be obtained at substantially the entire operation region.

Figure 13:
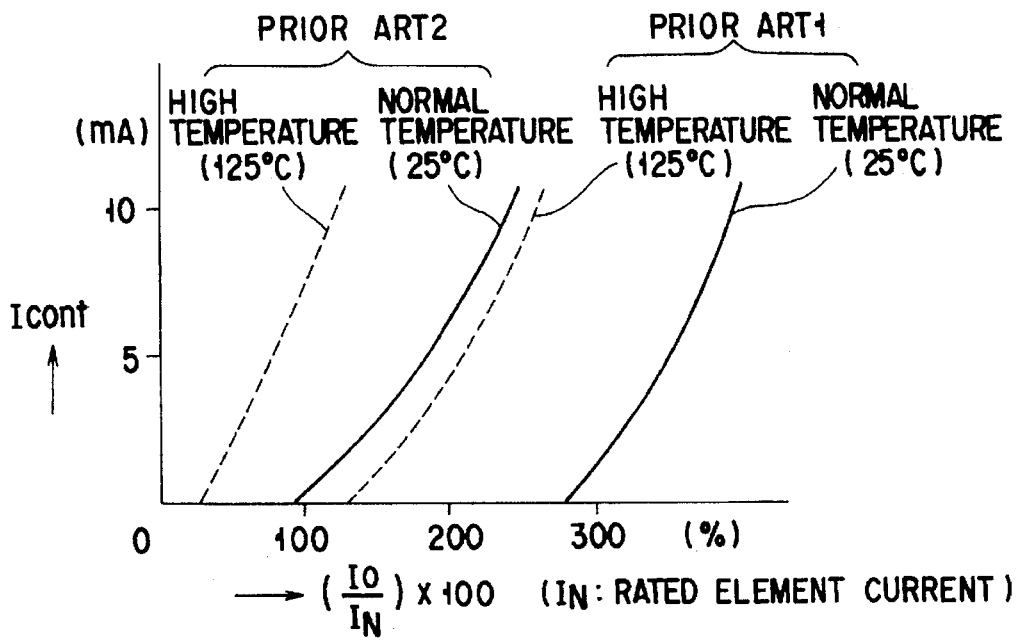
FIG. 13 is a graph showing actual measurement data of linearity of detection current vs. output current in the conventional current detector circuit shown in FIG. 8 and FIG. 9A.

In the second embodiment, the disadvantage in the first embodiment that the emitter potentials of the main and sense IGBTs can not be made equal to each other is eliminated. Specifically, the temperature dependency is significantly improved in compassion to the prior art, as will be understood when comparing the characteristic curves in FIG. 13 with the characteristic curves in FIG. 3. Furthermore, by selecting the resistance Rs to an optimal valve as shown in FIG. 2, the detection current (detection level of the detection current) can be set in an actually effective region with respect to the rated element current valve.

The above effect of the second embodiment is apparent from the characteristics (actual measurement data of the temperature dependence of the constant current output value at the preset value of the control current Icont) in FIG. 2 and the characteristics (actual measurement data of linearity of detection current vs. output current) in FIG. 3.

FIG. 5 shows a modification of the first embodiment shown in FIG. 1. FIG. 6 shows a modification of the second embodiment shown in FIG. 4. In a current detector circuit shown in FIG. 5 or 6, as compared with the current detector circuit of the first or second embodiment shown in FIG. 1 or 4, the collector of the control npn transistor 3 is connected to the gates of the first and second IGBTs 1 and 2. With this arrangement, when a current flows into the base of the control transistor 3 from the driver circuit 23 through the resistor 13 the control npn transistor 3 is turned on to lower the potential at the gate node of the first IGBT 1 to suppress the main current Io, thereby reducing the current of the first IGBT 1. Therefore, overcurrent detection and protection of the circuit device from breakdown caused by the overcurrent by a protection circuit can be performed. In each embodiment described above, the diode 12 may be replaced with a circuit using temperature variable type (the resistance value changes with a temperature change) resistor element 71 such as a thermistor and fixed resistor elements 72 and 73, as shown in FIG. 7.

According to a current detector circuit of the present invention, as has been described above, when a sense current flowing through a sense element for sensing part of a main current flowing through a main element is to be flowed in a detection resistor to cause a control transistor to detect a voltage drop across the detection resistor, the control current Icont and the main current Io have almost linear characteristics, the temperature dependence of a base-emitter threshold voltage of a control transistor during an operation can be compensated for, the control current flows simultaneously when the main current Io flows, and an overcurrent can be detected at an almost constant current level with respect to the main current Io during the operation. Overcurrent detection and a protective operation can be stably and accurately performed as compared with a conventional case. The current detector circuit of the present invention can be effectively used in a power switching element integrated circuit device having a large number of parallel-connected switching elements for a large capacity or a power element integrated circuit device in which a main element and a sense element are monolithically formed on a single substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A current detector circuit comprising a first insulating gate transistor for a main element;

a second insulating gate transistor for a sense element, a current input terminal of which is connected to a current input terminal of said first insulated gate transistor, and a control terminal of which is connected to a control terminal of said first insulated gate transistor, the second insulating gate transistor for sensing part of a main current flowing through said first insulating gate transistor;

a current detection resistor through which a sense current flowing through said second insulated gate transistor flows;

a control transistor for detecting a voltage drop across said current detection resistor; and a compensation diode connected between a control terminal of said control transistor and a current output terminal of said second insulated gate transistor.

2. A current detector circuit according to claim 1, wherein said diode is replaced with a circuit using a temperature variable type resistor element.

3. A current detector circuit according to claim 1, wherein a collector of said control transistor is commonly connected to said control terminal of said second insulated gate transistor.

4. A current detector circuit according to claim 3, wherein said diode is replaced with a circuit using a temperature variable type resistor element.

5. A current detector circuit according to claim 1, further including a forward bias generation resistor element for generating a forward bias applied to said diode for a time interval during which the main current flows.

6. A current detector circuit according to claim 5, wherein said diode is replaced with a circuit using a temperature variable type resistor element.

7. A current detector circuit comprising a first insulating gate transistor for a main element;

a second insulating gate transistor for a sense element, a current input terminal of which is connected to a current input terminal of said first insulated gate transistor, and a control terminal of which is connected to a control terminal of said first insulated gate transistor, the second insulating gate transistor for sensing part of a main current flowing through said first insulating gate transistor;

a current detection resistor through which a sense current flowing through said second insulated gate transistor flows;

a control transistor for detecting a voltage drop across said current detection resistor;

a constant current circuit, connected to a current output terminal of said first insulated gate transistor and a current output terminal of said second insulated gate transistor, the constant current circuit for setting potentials at said current output terminals of said first and second insulated gate transistors to equal to each other; and a compensation diode and a current detection resistor element which are inserted in series with each other between an output current path of the constant current circuit and a negative bias terminal.

8. A current detector circuit according to claim 7, wherein said diode is replaced with a circuit using a temperature variable type resistor element.

9. A current detector circuit according to claim 7, wherein a collector of said control transistor is commonly connected to said control terminal of said second insulated gate transistor.

10. A current detector circuit according to claim 9, wherein said diode is replaced with a circuit using a temperature variable type resistor element.

11. A current detector circuit according to claim 7, wherein said constant current circuit comprises a first pnp transistor, an emitter of which is connected to said current output terminal of said first insulated gate transistor, and a base and collector of which are connected to each other, a constant current value setting resistor element connected between a collector of said first pnp transistor and said negative bias terminal, and a second pnp transistor, an emitter of which is connected to said current output terminal of said second insulated gate transistor, and a base of which is connected to a base of said first pnp transistor, said second pnp transistor having a collector connected to an anode of said diode and a control terminal of said control transistor.

12. A current detector circuit according to claim 11, wherein said diode is replaced with a circuit using a temperature variable type resistor element.

13. A current detector circuit according to claim 4, wherein a collector of said control transistor is commonly connected to said control terminal of said second insulated gate transistor.

14. A current detector circuit according to claim 13, wherein said diode is replaced with a circuit using a temperature variable type resistor element.

* * * * *